United States Patent
Davis (10) Patent No.: US 8,818,766 B2
(45) Date of Patent: Aug. 26, 2014

(54) SYSTEMS AND METHODS PROVIDING SMART NODES FOR THREE-DIMENSIONAL MODELS

(75) Inventor: Jason B. Davis, Glendale, CA (US)

(73) Assignee: Disney Enterprises, Inc., Burbank, CA (US)

( * ) Notice: Subject to any disclaimer, the term of this patent is extended or adjusted under 35 U.S.C. 154(b) by 833 days.

(21) Appl. No.: 12/771,678

(22) Filed: Apr. 30, 2010

(65) Prior Publication Data

US 2011/0270582 A1  Nov. 3, 2011

(51) Int. Cl.
*G06F 17/50* (2006.01)

(52) U.S. Cl.
USPC .............................................. 703/1

(58) Field of Classification Search
CPC ....................................... G06F 17/50
USPC ................. 703/1; 434/72; 345/418, 420
See application file for complete search history.

(56) References Cited

U.S. PATENT DOCUMENTS

| | | | |
|---|---|---|---|
| 4,385,361 A * | 5/1983 | Moates | 358/1.6 |
| 2005/0131659 A1 * | 6/2005 | Mei et al. | 703/1 |

* cited by examiner

*Primary Examiner* — Kamini S Shah
*Assistant Examiner* — Luke Osborne
(74) *Attorney, Agent, or Firm* — Ference & Associates LLC (57) ABSTRACT

Embodiments of the invention provide systems and methods for creating physical and virtual design models. Embodiments of the invention provide methods for creating physical design models and rendering the physical design models as virtual models in design programs. Virtual indicia (smart nodes) provided by embodiments of the invention provide customizable virtual representations of modeled physical design elements of tangible models and can have metadata associated therewith, allowing attribution of any of a wide variety of design characteristics to the smart nodes.

13 Claims, 8 Drawing Sheets

FIG. 1

100 Actual (Physical, Tangible) Model

FIG. 2

200 Actual (Physical, Tangible) Model

FIG. 3

300 Scanned (Virtual) Model

FIG. 4

400 3D (Virtual) Model

SYSTEMS AND METHODS PROVIDING SMART NODES FOR THREE-DIMENSIONAL MODELS

BACKGROUND

The subject matter presented herein generally relates to design programs used in project design and development, particularly in connection with building information modeling (BIM). The present invention relates generally to computer-aided design (CAD) and, more specifically, to replacing complex three-dimensional (3D) CAD objects with simple 3D shapes that capture metadata using 3D design software associated with importing object locations in a physical model into a CAD model of the physical model.

Conventional computer-aided design programs, for example AutoCAD® design program, focus strongly on 2D drawing and have functionality for designers to create two-dimensional objects, such as a door or a window, having metadata associated therewith. In this 2D context, the object can be conceived as an editable 2D object that may be customized within predefined limits. For example, in a conventional CAD program, one may position a door or a window within the 2D model, customizing the object (door or window in this example) by editing, for example, the object's dimensions (length, width, height), which correspond to pre-conceived, standardized fields. Thus, such conventional 2D design programs allow the designers to create custom, two-dimensional blocks within the design diagram to represent design elements.

Other design programs, such as Autodesk® 3ds Max® software, work almost exclusively in a 3D drawing environment with tools designed for creating, modeling, texturing, animating and rendering of 3D drawing objects with a high degree of realism. Still further, Autodesk® NavisWorks® software provides for 3D visualization, evaluation, online collaboration and animation. Thus, conventional 3D design programs involve the creation of complex 3D objects. AutoCAD®, Autodesk® 3ds Max®, and Autodesk® NavisWorks® are registered trademark of Autodesk, Inc., in the United States and other countries.

BRIEF SUMMARY

Aspects of the invention broadly creation of smart nodes within a virtual design model. The smart nodes provided by embodiments of the invention comprise geometric shapes which are simple to create yet customizable, allowing attribution (tagging) of any of a wide variety metadata corresponding to design characteristics associated with physically modeled design elements, particularly complex design elements not typically encountered in traditional building projects. Thus, the smart nodes provided according to embodiments of the invention enable quick reference points within a virtual model for a wide variety of design elements having in certain cases complex infrastructure information associated therewith.

In summary, one aspect of the invention provides a method comprising: physically associating pins with a tangible architectural model; scanning the tangible architectural model having the pins associated therewith; rendering a virtual model derived from the scanned tangible architectural model; placing virtual indicia in the virtual model in place of scanned representations of the pins; and associating metadata with the one or more virtual indicia.

Another aspect of the invention provides a set of physical indicia for use in designing a tangible architectural model, the set of physical indicia comprising: a plurality of physical indicia that are attachable to the tangible architectural model; wherein each of the plurality of physical indicia are recognizable in a scanned image of the tangible architectural model; and wherein each of the plurality of physical indicia have recognizable characteristics that enable their appearance in the scanned image to be distinguished from at least one other of the plurality of physical indicia.

A further aspect of the invention provides a system comprising: a processor configured to execute computer program instructions tangibly stored in a computer readable storage medium, the computer program instructions comprising: computer readable program code configured to render a virtual model derived form a scanned architectural model; computer program code configured to recognize placement of indicia within the scanned tangible architectural model, the indicia within the scanned tangible architectural model corresponding to one or more modeled physical design elements of the tangible architectural model; computer program code configured to replace the indicia of the scanned architectural model with virtual indicia in the virtual model; computer readable program code configured to associate metadata with the virtual indicia.

DETAILED DESCRIPTION

Producing a robust virtual design model is very useful for completing various design projects. Building information modeling is the process of providing and managing building data, typically using three-dimensional (3D), real-time, dynamic building modeling software to increase productivity in design and construction. A building information model (BIM) is often used, which graphically represents spatial relationships of various design elements and properties thereof.

In building certain projects, for example complex park attractions having scenes featuring complex design elements such as animated characters, scenery, and the like, a robust building model, such as a BIM, that is easily constructed at early stages of the project, is an important aspect of the design process.

The inventor has recognized that while conventional two-dimensional (2D) and 3D design programs are available that provide the ability to assign metadata to drawing block objects (tagging design elements) within a virtual model, these design programs are limited in certain respects. For example, conventional design programs only provide the ability to assign metadata to the objects that fall within generic, standardized fields, preconceived consistent with conventional building categories. Moreover, existing 3D drawing programs are configured for the faithful drawing of the design elements within the virtual model. Thus design elements are incorporated into the 3D virtual model using conventional design programs by faithfully drawing the physical object and then assigning one of these generic metadata fields.

The inventor recognized that the physical objects (design elements) did not need to be faithfully reproduced (drawn into) in the virtual model, but rather that the representation of the physical objects in the physical model could be replaced with simple indicia (for example, physical pins). The placement of these pins could be automatically recognized and placed on a virtual model through a scanning process, where a digital scan of the physical model is performed in order to render a virtual model within a modeling program. Furthermore, the pins could be replaced within the virtual model by simple virtual indicia, such as geometric shapes, customized (for example, by modulating their size, colors and/or shapes) as desired, and an expanded set of metadata could be associated with these geometric shapes in order to provide easy access to useful information regarding the design elements.

Accordingly, embodiments of the invention are configured to enable quick and easy production of a virtual design model that integrates various design elements of the physical mode as smart nodes (virtual indicia) in the virtual model, the smart nodes having customizable metadata associated therewith. Embodiments of the invention provide increased flexibility and customizability with respect to the model building process, valuable for example in designing specialized projects having complex design elements. It should be noted that while embodiments of the invention are described with respect to building a 3D model, certain aspects of the invention are equally applicable to creating a 2D model.

The illustrated embodiments of the invention will be best understood by reference to the drawings/figures. The following description is intended only by way of example and simply illustrates certain exemplary embodiments of the invention as claimed herein.

Figure 1:
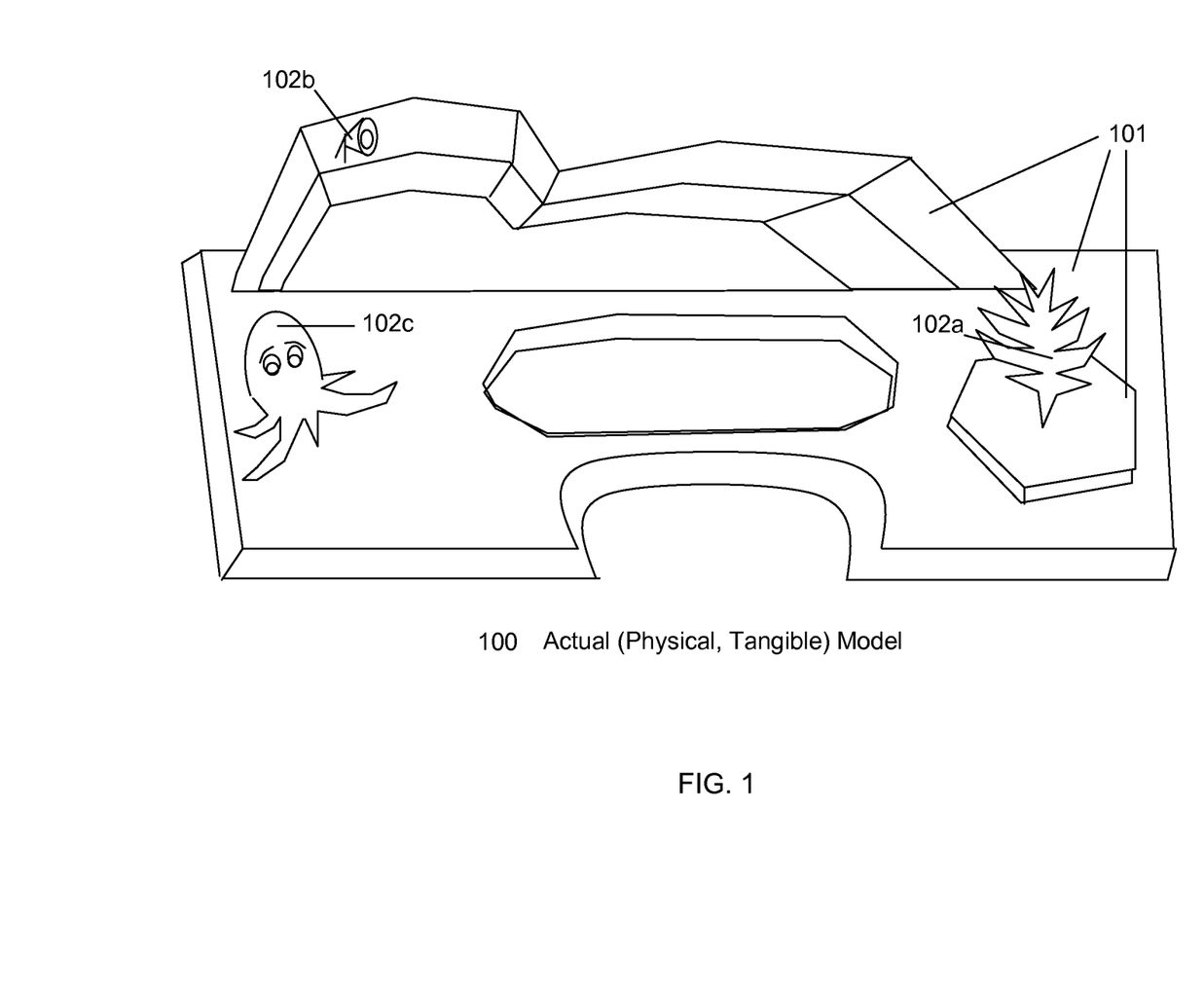
FIG. 1 illustrates a (tangible) three-dimensional scaled design model having design elements according to an embodiment.

Referring to FIG. 1, illustrated is a portion of an actual (physical, tangible), scaled model 100. The scaled model 100 is composed, for example, of foam and painted to accurately depict the particular design. The scaled model 100 depicted in FIG. 1 is a simplified illustration of a scaled architectural model of a park attraction, and is used as a working example to highlight aspects of the invention.

At the start of a design project, it is common for such a scaled model 100 to be constructed by the design team. The scaled model 100 is useful for example in visualizing the overall design and different elements thereof, as they will be arranged throughout the design, and reaching a consensus on what the overall project design should look like when built. Thus, the scaled model 100 gives a high level view of the design concept. The scaled model 100 illustrated in FIG. 1 includes a rockwork environment 101, essentially used as a base layer on which the various other design elements 102(a-c) are placed. Often design elements will be complex and require, when actually built, various support services (infrastructure) offered by contractors (for example, providing mechanical motion and/or sound to the design elements, et cetera).

As illustrated, design element 102a is a simple piece of scenery (a plant) and will not require any special support infrastructure, such as electricity. However, other design elements are more complex, perhaps with the ability to move and/or emit sound, such as design elements 102b (animated character which moves) and 102c (sound speaker). Moreover these design elements are complex inasmuch as they do not neatly fit within conventional design element categories (door, window, et cetera). The feasibility of the design is often contingent upon the ability of contractors to provide the design elements 102(a-c) per design team specifications during the actual build. As such, having detailed, custom metadata regarding the feasibility of constructing various design elements is often useful for evaluating and modifying designs against contractor abilities.

In order to create a 3D virtual design model based on the physical model 100, a designer has a variety of choices. As discussed herein, a designer may recreate (that is, draw in) the entire scale model utilizing a conventional 3D modeling program. Recreating the design elements virtually is, however, time consuming and complex. Additionally, the generic metadata fields often do not neatly fit with various complex design elements (for example, animated character 102c).

Figure 2:
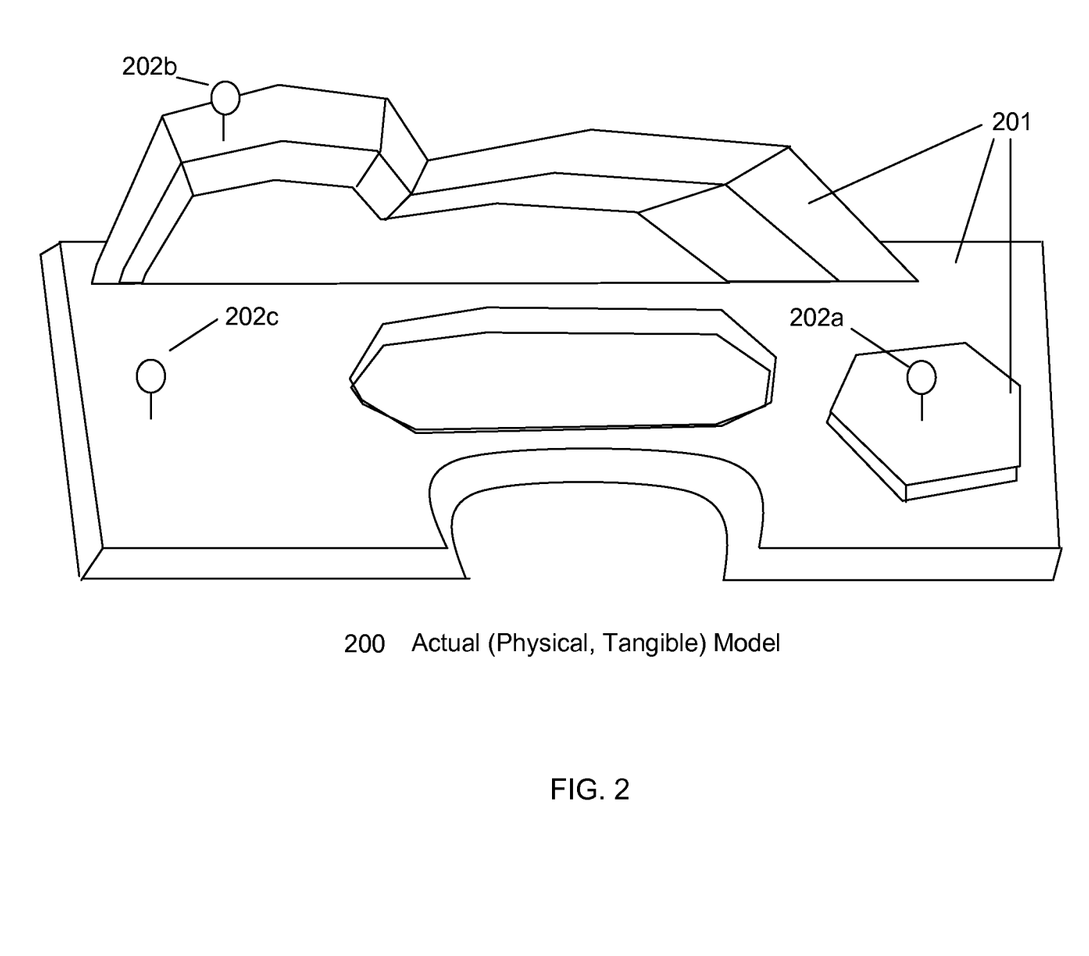
FIG. 2 illustrates a (tangible) three-dimensional scaled design model having pins according to an embodiment.

Thus, referring to FIG. 2, according to an embodiment of the invention, a designer replaces the physical design elements with simple pins 202(a-c). In the exemplary scale model 100 illustrated in FIG. 1, a majority of the design is the underlying rockwork 101 with design elements 102(a-c) placed thereon. Thus, the physical design elements 102(a-c) could be removed from the rockwork 101 environment of the scale model 100 and replaced with physical pins 202(a-c) representing the physical design elements (or physical pins can be placed along with the design elements without removing the physical design elements). The underlying rockwork 201 remains in the physical design model along with physical pins 202(a-c), for example having an easily recognized shape/size, in lieu of or in addition to the physical design elements 102.

Figure 3:
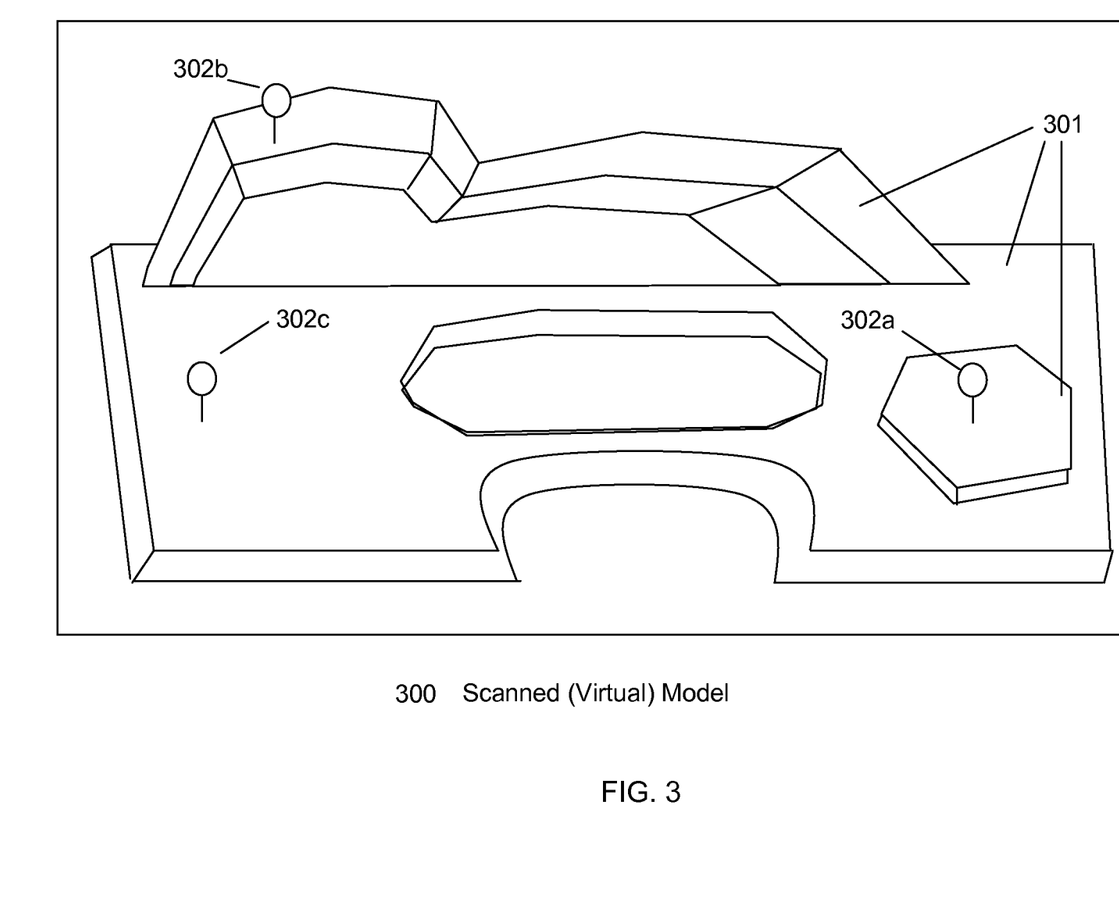
FIG. 3 illustrates a three-dimensional scanned (virtual) model having pins according to an embodiment.

As illustrated in FIG. 3, a digital scan of the scaled physical model 200 (having the pins therein) is made. This scanned model 300 is utilized as input for a system to create a 3D virtual design model having smart nodes and associated metadata (smart tags), as described further herein. The scanned model 300 serves as the starting point for a simple process of modeling essential features of the physical design, including the underlying rockwork environment 301 and the various physical design elements. Once the scanned model 300 has been produced, the physical design elements remain represented by the scanned representations of the physical pins 302(a-c).

As illustrated in FIG. 3, having the representations of the physical pins 302(a-c) representing the location of the design elements in the three-dimensional representation is useful inasmuch as the location of the physical design elements can be represented virtually in a 3D look easily without losing important placement information. However, it will be additionally useful to provide additional information regarding the various physical design elements. Certain physical design elements may require support services (that is, will require support services provided by contractors when the physical design elements are actually built, such as moving/animated design elements needing electrical wiring, et cetera), whereas certain other physical design elements will not (for example, stationary design elements such as a plant). As a non-limiting example, physical design element 102c comes through the scan as a simple representation of the physical pin 302c. However, this physical design element 102c is an animated character, which is a complex physical design element (for example, has a specific weight, is made of a specific material, requires electricity, et cetera). Simply representing physical design element 102c as pin 302c overlooks certain information that can prove useful to the design team. Moreover, it may be useful to categorize other, similar animated characters (not shown) with a similar representation, setting them apart visually from other design elements. Thus, embodiments of the invention provide for use of customizable smart nodes, placed in the 3D virtual model.

Figure 4:
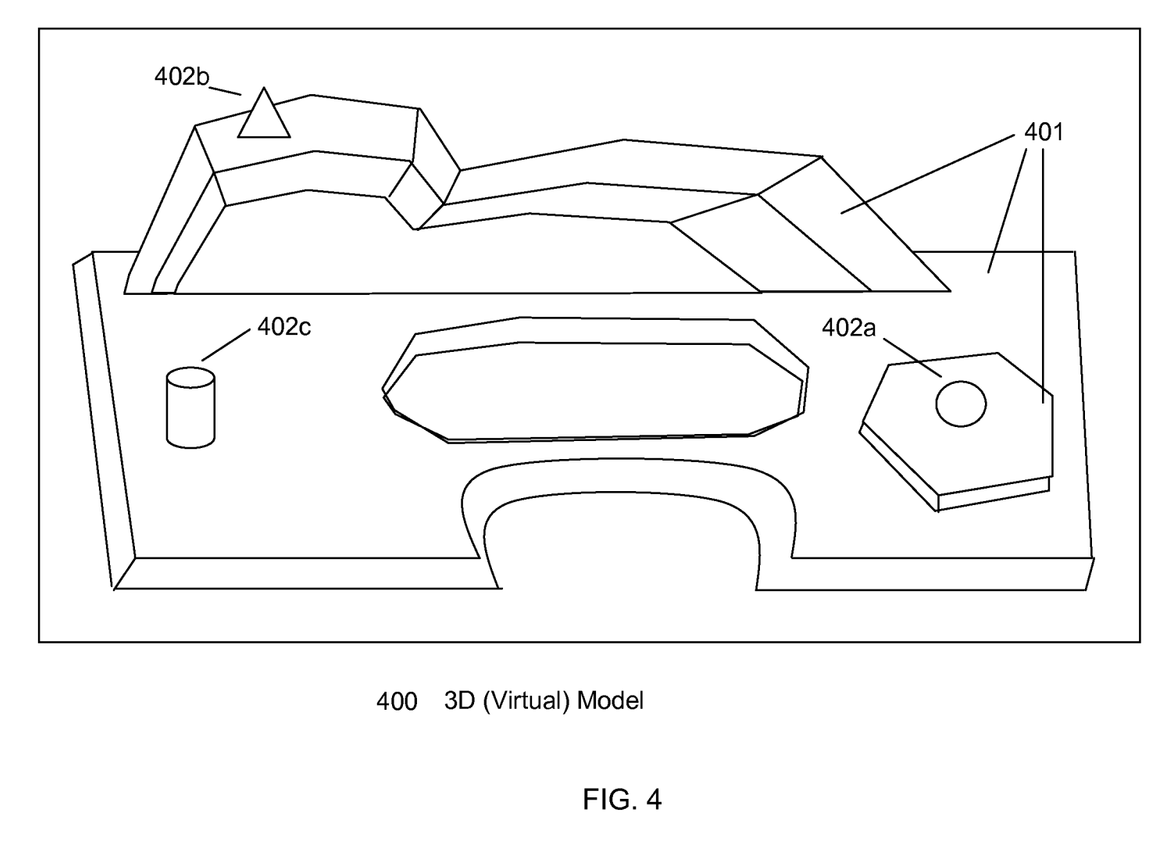
FIG. 4 illustrates a three-dimensional (virtual) model having smart nodes according to an embodiment.

As illustrated in FIG. 4, smart nodes 402(*a-c*) according to an embodiment of the invention are illustrated in a 3D virtual model 400 of a design. As shown, smart nodes 402(*a-c*) of different shape, size, color, et cetera can be utilized to differentiate between different physical design element categories (having different associated characteristics, for example physical design elements 102(*a-c*)) that populate the rockwork environment 401. Essentially any feature/indicia that can be can be used to distinguish one design element from another can be used to impart distinctions and meanings to the pins. For example, a small, color 1, shape 1 smart node 402a can be utilized to represent scenery physical design element 102a, which would generally not require much coordination with contractors. A small, color 2, shape 2 smart node 402b can be utilized to represent a sound speaker physical design element 102b that would require coordination with electrical contractors. Still further, a large, color 3, shape 3 smart node 402c can be used to represent animated character physical design element 402c that requires coordination with one or more contractors. Thus, each physical design element (102 (*a-c*)) may be represented in the overall 3D virtual design without necessitating the drawing in of virtual design elements. Moreover, embodiments of the invention additionally provide for tagging the smart nodes with metadata, for example information regarding the associated characteristics of the physical design elements, particularly as they relate to coordination efforts with other team members in the design process.

Figure 5:
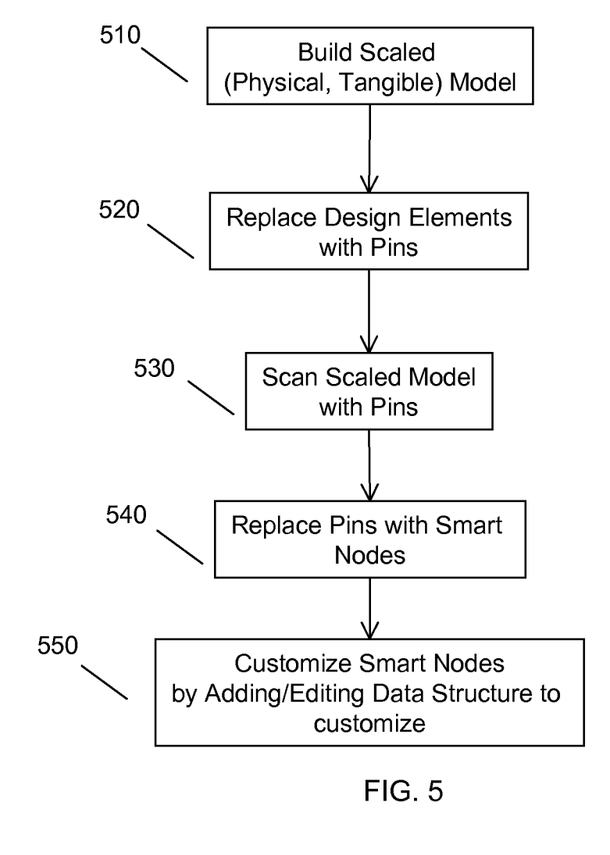
FIG. 5 illustrates an exemplary method for creating a three-dimensional (virtual) model having smart nodes according to an embodiment.

Referring to FIG. 5, an exemplary overall method according to an embodiment is illustrated. As described herein, the process generally begins at 510 with a scaled physical model being built, perhaps of foam or a similar material, by design team members with expertise in building physical models. These physical models can be rather elaborate, depending on the design piece being built, and can therefore include a myriad of different physical design elements that encompass a wide variety of characteristics which in turn require a wide variety of infrastructure support services offered by different contractors. The effort required to accurately represent the physical model and the various design elements in a 3D virtual model can be substantial when using conventional 3D modeling techniques.

Thus, according to the exemplary method, at 520 physical pins are placed in the physical model (in place of or in addition to these design elements). The model with physical pins is then digitally scanned 530, allowing it to be rendered within a 3D modeling program. Once scanned and virtualized within a 3D modeling program, the representations of the physical pins can be automatically detected by associating recognizable characteristics with the physical pins, detectable within the scanned image of the physical model. For example, the recognizable characteristics can be selected from the group consisting of size, color, shape, reflectivity, absorption, pattern, symbol, alphanumeric indicia, and emission characteristics of the physical pins. The process of detecting the representations of the physical pins can include optional manual input by a user for detecting the representations of the physical pins.

Once the representations of the physical pins are detected, they can be replaced 540 with virtual indicia (smart nodes), as desired. For example, all animated characters may be represented by smart nodes of a certain shape, color, and/or size. Likewise, scenery design elements may be represented by their own shape, color and/or size. Thus, the physical design elements, although represented by simple geometric shapes virtually, are clearly distinguishable to the design team members. Similar to detecting the representations of the physical pins, their replacement with virtual indicia can be automated based on a predetermined semantic meaning, as described further herein. Finally, the smart nodes can be further augmented by associating metadata at 550; that is, tagged with pertinent information useful in a variety of contexts, such as for convenient review of a wide variety of infrastructure requirements of the actual, physical design elements.

Figure 6:
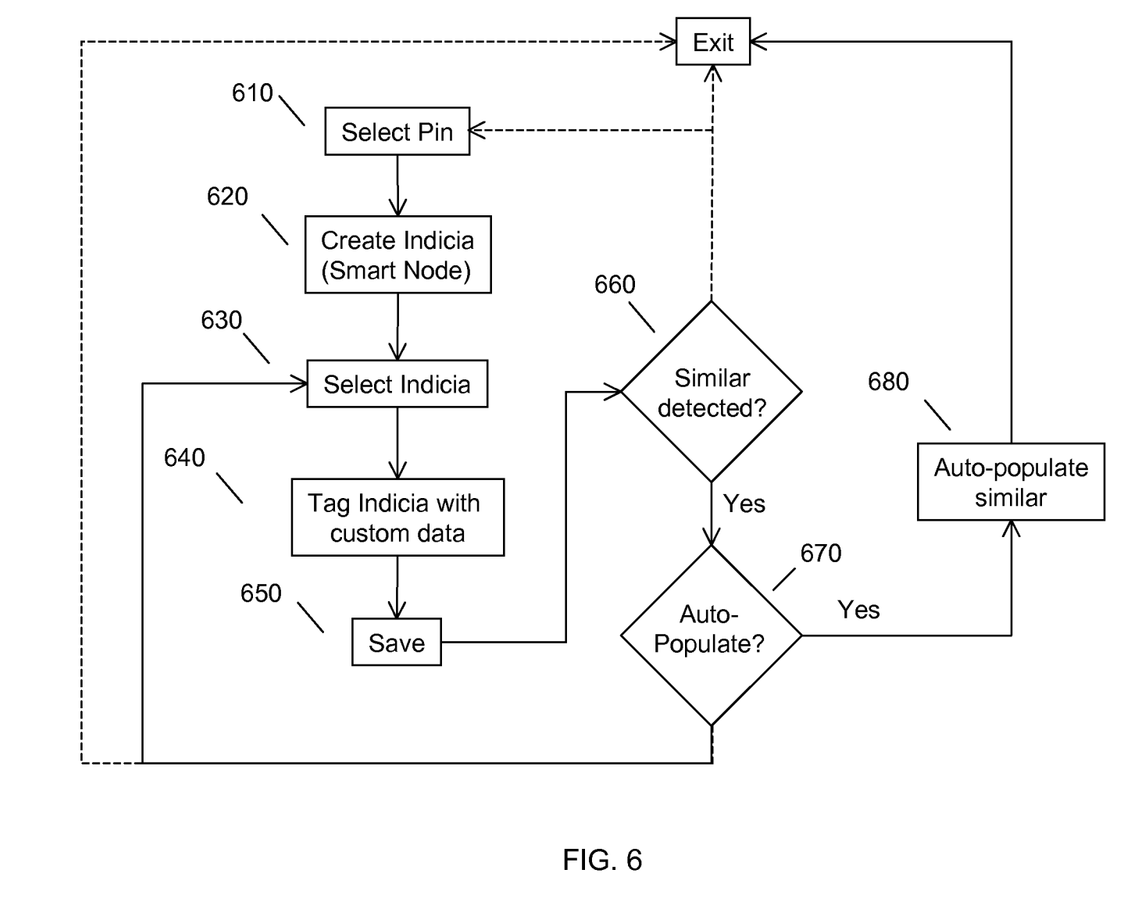
FIG. 6 illustrates an exemplary method of creating smart nodes and tags associated therewith according to an embodiment.

FIG. 6 illustrates an exemplary method by which the representations of the scanned pins 402(*a-c*) can be converted into smart nodes and tagged with metadata within a 3D modeling program. Associating metadata with smart nodes can be accomplished automatically or manually. For example, automatic association of metadata can be accomplished by configuring the physical pins to have a predetermined semantic meaning recognizable by a computer system. Pre-stored metadata can then be automatically associated with the smart nodes based on the detected semantic meaning associated with the physical pins. For example, the smart node placed for a scanned representation of a particular type of physical pin can be pre-assigned to certain metadata which can then be added automatically by a computer system.

As an example, a scanned representation of a pin of interest is selected at 610. Once selected, a smart node is created to replace the representation of the pin at 620. The smart node can take any of a variety of forms, for example, by assigning a specific geometric shape having a particular color and/or size. Once the smart node has been created, the smart node is selected at 630 and tagged at 640 with various types of metadata. Thereafter, the metadata is saved at 650 for later review. As representations of pins are replaced with smart nodes, the process can step through representations of pins at 660 to repeat entry of the metadata for similarly detected representations of pins. Thus, the system can be configured to, for example, prompt the user at 670 with an option to automatically populate 680 similarly detected representations of pins similar smart nodes and with similar metadata containing the previously entered information. The user may manually operate the system and/or exit the system at any time with or without saving the changes.

Figure 7:
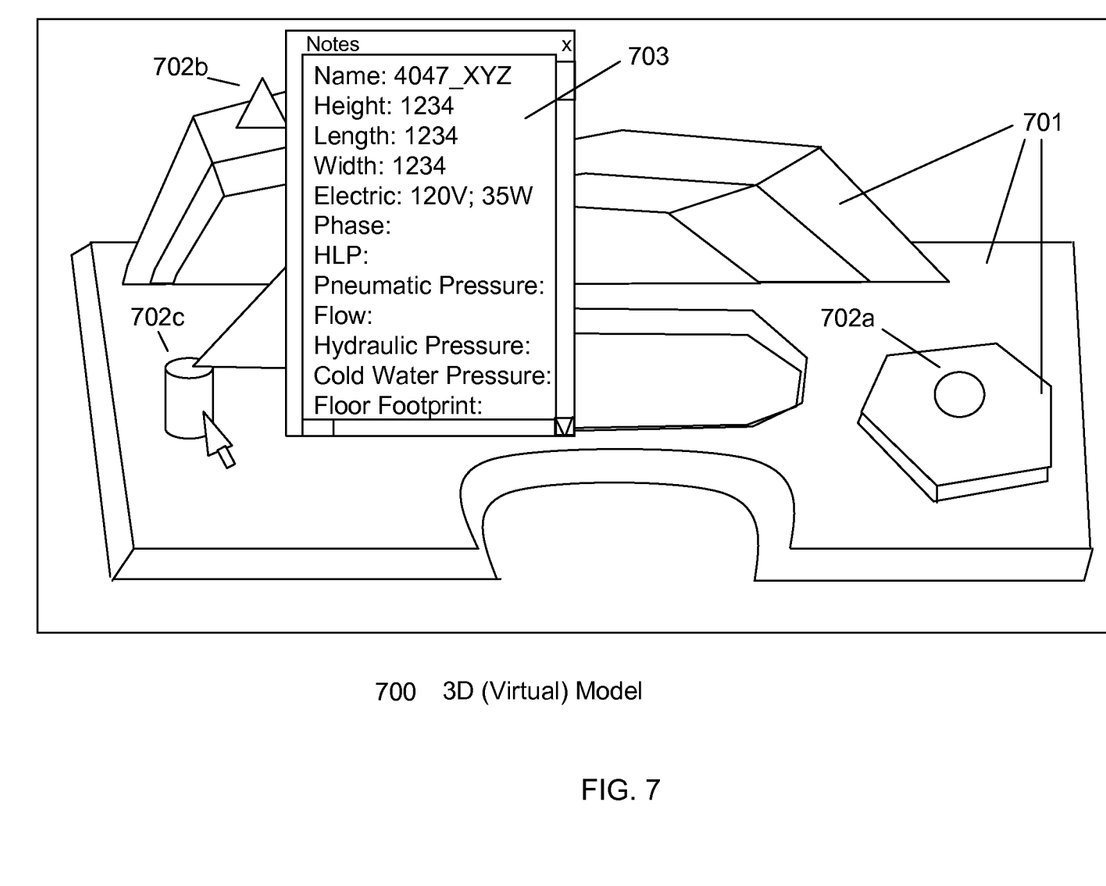
FIG. 7 illustrates an exemplary smart node having information associated therewith according to an embodiment.

Referring to FIG. 7, a 3-D virtual model 700 is represented, including the rockwork environment 701, the physical design elements as represented virtually by smart nodes 701(*a-c*), and additionally the metadata information attributed to a smart node 701c is displayed within a display window 703 of the 3D virtual model 700. The display window 703 containing the attributed information can be brought up for display in a variety of ways, such as positioning the mouse over the smart node and/or double clicking the smart node. The contents of the display window 703 are customizable such that any of a wide variety of metadata can be created and be attributed to the smart node, per the design context encountered. For example, a text box can be provided, allowing a user to type in whatever information is relevant to the particular physical design element being virtually represented. Moreover, the user can create custom fields for the metadata assigned to the virtually represented design elements. Therefore, the smart nodes facilitate easy and quick review of the virtually represented design elements in a 3D virtual model, making coordination efforts between various design teams (for example, designers and contractors) much easier. Thus, the system is configured to store the metadata tagged to the smart nodes for retrieval as desired.

Those having ordinary skill in the art will readily understand that embodiments of the invention may be implemented using one or more computer systems. In this regard, a non-limiting and exemplary computer system is described herein.

Figure 8:
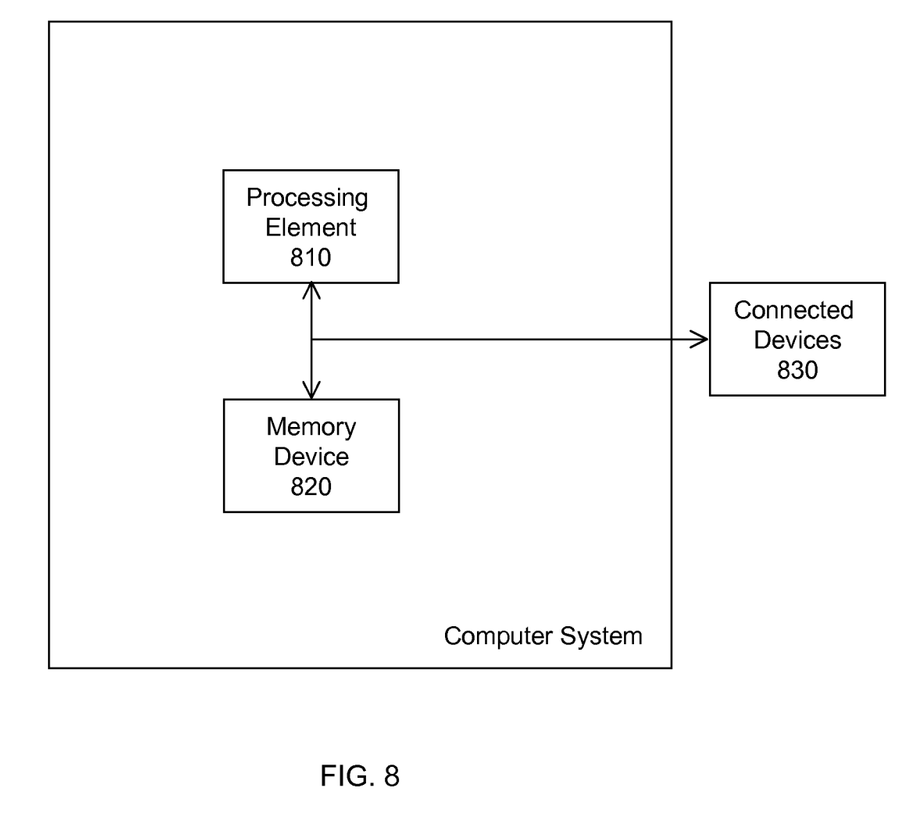
FIG. 8 illustrates an exemplary computer system according to an embodiment.

As shown in FIG. 8, aspects of the invention may be carried out in a computer system, such as user workstations, personal computers, or other client devices. In FIG. 8, an exemplary computer system can include a processing element 810, such as a processor, controller or the like, and an associated memory device 820, both of which are commonly included in computer systems used in connection with 3D modeling. Moreover, it will be understood that the computer system may be connected to various connected devices 830, such as display devices, other computer systems, and the like.

In this regard, various aspects of the exemplary methods described above according to embodiments of the invention can be performed by the processing element 810 executing computer program instructions (including computer program code) stored by and accessible from, for example, the memory device 820. Thus, it will be understood that certain operations described herein can be implemented by executing computer program instructions that are tangibly stored on a computer readable program storage device, such as memory device 820, such that a computer system can be directed to function in a particular manner. The memory device 820 may also store the metadata in some embodiments.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A method comprising:
providing a tangible architectural model;
physically associating pins in locations of one or more design elements of the tangible architectural model;
thereafter scanning the tangible architectural model having the pins associated therewith to create an image of the tangible architectural model;
rendering a virtual model derived from the scanned tangible architectural model;
selecting scanned representations of the pins in the scanned tangible architectural model;
placing virtual indicia in the virtual model in place of the scanned representations of the pins; and
associating metadata with the one or more virtual indicia.

2. The method according to claim 1, wherein the metadata comprises customized information corresponding to the design elements of the tangible architectural model.

3. The method according to claim 1, further comprising automatically recognizing the pins in the scanned tangible architectural model.

4. The method according to claim 1, wherein the virtual model comprises a two-dimensional model.

5. The method according to claim 1, wherein the virtual model comprises a three-dimensional model.

6. The method according to claim 1, wherein the virtual indicia comprise one or more geometric shapes.

7. The method according to claim 2, wherein associating metadata with the virtual indicia further comprises entering textual descriptions of the virtual indicia.

8. The method according to claim 3, wherein placing the virtual indicia further comprises automatically placing the virtual indicia in the virtual model in place of one or more pins.

9. The method according to claim 2, wherein associating metadata with the virtual indicia further comprises automatically associating metadata with the virtual indicia via recognition of a semantic meaning associated with one or more of the virtual indicia and associating metadata according to the semantic meaning.

10. A system comprising:
a non-transitory computer readable storage medium;
a processor configured to execute computer program instructions tangibly stored in the non-transitory computer readable storage medium, the computer program instructions comprising:
computer readable program code configured to access an image of a tangible architectural model in which a plurality of pins are attached to the tangible architectural model in locations of design elements of the tangible architectural model;
computer readable program code configured to render a virtual model derived from the scanned architectural model;
computer readable program code configured to select scanned representations of the pins;
computer program code configured to replace the scanned representations of the pins with virtual indicia in the virtual model;
computer readable program code configured to associate metadata with the virtual indicia.

11. The system according to claim 10, wherein the computer readable program code configured to associate metadata with the virtual indicia is further configured to associate metadata with virtual indicia in response to user input.

12. The system according to claim 10, wherein the wherein the computer readable program code configured to associate metadata with the virtual indicia is further configured to automatically associate metadata with the virtual indicia according to a predetermined semantic meaning associated with the modeled physical design elements of the tangible architectural model.

13. The system according to claim 10, wherein the metadata comprises design element specifications corresponding to the design elements of the tangible architectural model.

* * * * *